(12) United States Patent
Schweiger et al.

(10) Patent No.: US 11,333,710 B2
(45) Date of Patent: May 17, 2022

(54) METHOD AND DEVICE FOR ESTIMATING A VOLTAGE OF A BATTERY

(71) Applicants: Bayerische Motoren Werke Aktiengesellschaft, Munich (DE); BMW Canada Inc., Richmond Hill (CA)

(72) Inventors: Benno Schweiger, Munich (DE); Matthias Fleckenstein, Isen (DE); Edwin Knobbe, Pfaffenhofen A. D. Ilm (DE); Mohammed Farag, Hamilton (CA); Saeid Habibi, Hamilton (CA)

(73) Assignees: BAYERISCHE MOTOREN WERKE AKTIENGESELLSCHAFT, Munich (DE); BMW CANADA INC., Ontario (CA)

( * ) Notice: Subject to any disclaimer, the term of this patent is extended or adjusted under 35 U.S.C. 154(b) by 584 days.

(21) Appl. No.: 16/313,854

(22) PCT Filed: Jun. 28, 2016

(86) PCT No.: PCT/EP2016/064998
§ 371 (c)(1),
(2) Date: Dec. 27, 2018

(87) PCT Pub. No.: WO2018/001460
PCT Pub. Date: Jan. 4, 2018

(65) Prior Publication Data
US 2019/0154762 A1 May 23, 2019

(51) Int. Cl.
*G01R 31/382* (2019.01)
*G01R 31/367* (2019.01)
(Continued)

(52) U.S. Cl.
CPC ............ *G01R 31/382* (2019.01); *B60L 58/12* (2019.02); *G01R 19/16542* (2013.01);
(Continued)

(58) Field of Classification Search
CPC ............ G01R 19/16542; G01R 31/367; G01R 31/382; H01M 2010/4271; B60L 58/12; B60L 58/15; Y02T 10/70; Y02E 60/10
See application file for complete search history.

(56) References Cited

U.S. PATENT DOCUMENTS 6,534,954 B1   3/2003  Plett
8,332,342 B1 * 12/2012  Saha .................... G01R 31/392
                                                               706/45
(Continued)

FOREIGN PATENT DOCUMENTS

DE   102013000572 A1   7/2014
EP       2551687 A1    1/2013
(Continued)

OTHER PUBLICATIONS

Ning et al., Cycle Life Modeling of Lithium-Ion Batteries, Journal of Electrochemical Society 151 (2004), pp. A1584-A1591 (Year: 2004).*

(Continued)

*Primary Examiner* — Kyle R Quigley
(74) *Attorney, Agent, or Firm* — Morgan, Lewis & Bockius LLP

(57) ABSTRACT

In a method for estimating a voltage of a battery a given battery model (BM) is provided, wherein the given battery model (BM) is a single particle model. A C-rate of the battery is determined. The battery model (BM) is adapted based on the C-rate. The voltage of the battery is estimated by means of the adapted battery model (BM).

8 Claims, 3 Drawing Sheets

Figure 1:
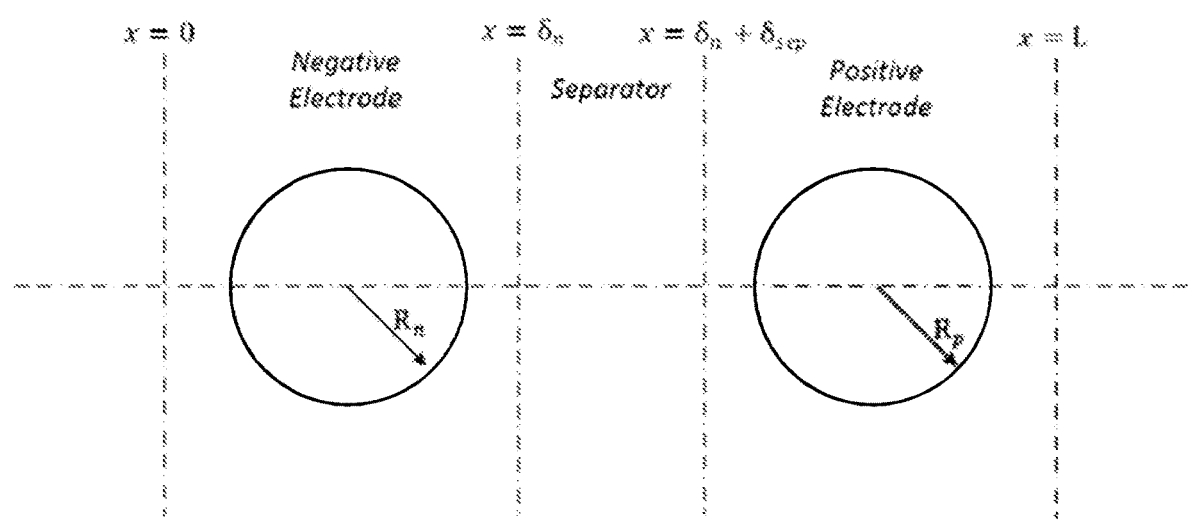

(51) Int. Cl.
  *B60L 58/12* (2019.01)
  *G01R 19/165* (2006.01)
  *H01M 10/42* (2006.01)
  *B60L 58/15* (2019.01)

(52) U.S. Cl.
  CPC ........ *G01R 31/367* (2019.01); *H01M 10/425* (2013.01); *B60L 58/15* (2019.02); *H01M 2010/4271* (2013.01); *Y02T 10/70* (2013.01)

(56) References Cited

U.S. PATENT DOCUMENTS

| | | | | |
|---|---|---|---|---|
| 2009/0295337 | A1* | 12/2009 | Ishikawa | H01M 10/052 320/148 |
| 2010/0072955 | A1* | 3/2010 | Ishikawa | H01M 10/44 320/160 |
| 2014/0210418 | A1* | 7/2014 | Wang | H02J 7/00 320/134 |
| 2014/0244193 | A1 | 8/2014 | Balasingam et al. | |
| 2015/0251556 | A1 | 9/2015 | Meyer | |
| 2015/0349385 | A1 | 12/2015 | Hu et al. | |
| 2015/0355283 | A1 | 12/2015 | Lee | |
| 2016/0003913 | A1* | 1/2016 | Zhu | G01R 31/367 702/63 |

FOREIGN PATENT DOCUMENTS

| | | |
|---|---|---|
| KR | 10-2012-0028000 A | 3/2012 |
| KR | 10-2016-0035698 A | 1/2016 |

OTHER PUBLICATIONS

Moura, Battery State Estimation for a Single Particle Model With Electrolyte Dynamics, IEEE, 2016 (Year: 2016).*

* cited by examiner

METHOD AND DEVICE FOR ESTIMATING A VOLTAGE OF A BATTERY

The invention relates to a method for estimating a voltage of a battery. The invention relates further to a corresponding device.

In the past few years, automobile manufacturers have gone through the initial adoption phase of electric mobility. The gradually increasing momentum behind electric vehicle (EV) adoption suggests that electrified storage systems will play an important role in electric mobility going forward. Lithium ion batteries have become one of the most attractive alternatives for electric vehicles' energy storage systems due to its lightweight, high specific energy, low self-discharge rate, and non-memory effect. To fully utilize the lithium ion energy storage systems and avoid its physical limitations, an accurate battery management system (BMS) is required. In EV, BMS is responsible for performance management which include—but not limited to—state of charge (SOC), state of health (SOH), state of function (SOF) estimation algorithms, power management, and thermal management, etc. One of the key issues for the BMS is the battery model. A robust, accurate, and high fidelity battery model is required to mimic the battery dynamic behaviour in harsh environment.

The object of the invention is to estimate the voltage of a battery by means of an accurate model.

This object is achieved by the features of the independent claims. Advantageous embodiments of the invention are given in the sub-claims.

The invention is distinguished by a method for estimating a voltage of a battery. The invention is further distinguished by a corresponding device for estimating a voltage of a battery. In the method, a given battery model is provided, wherein the given battery model is a single particle model. A C-rate of the battery is determined. The battery model is adapted based on the C-rate. The voltage of the battery is estimated by means of the adapted battery model.

The estimated voltage of the battery can, for example, be used to estimate a State of Charge of the battery.

A C-rate relates to the charge or discharge current in reference to the capacity of the battery. For example, a C-rate of 1C relates to a charge or discharge current of 2000 mA if the battery has a capacity of 2000 mAh, or to a charge or discharge current of 700 mA if the battery has a capacity of 700 mAh and a C-rate of 2C relates to a charge or discharge current of 4000 mA if the battery has a capacity of 2000 mAh, or to a charge or discharge current of 1400 mA if the battery has a capacity of 700 mAh.

Accurate battery State of Charge (SoC) estimation algorithms are currently of extreme importance due to their applications in electrified transportation and energy storage systems. To guarantee safety, durability, and performance, battery management systems within these advanced transportation and energy infrastructures must have accurate knowledge of internal battery energy levels. Such knowledge enables them to efficiently reuse energy while satisfying power demands and device-level operating constraints.

Monitoring battery SOC and State of Health (SoH) is particularly challenging for several technical reasons. First, directly measuring Li-concentration or physical examination of cell components is impractical outside specialized laboratory environments. Second, the dynamics are governed by partial differential algebraic equations derived from electrochemical principles. The only measurable quantities (voltage and current) are related to the states through boundary values. Finally, the model's parameters vary widely with electrode chemistry, electrolyte, packaging, and time.

The research on battery SOC/SOH estimation has experienced considerable growth. That may divide by the battery models each algorithm employs: The first category considers estimators based upon equivalent circuit models (ECMs). These models use circuit elements to mimic the phenomenological behavior of batteries. The key advantage of ECMs is their simplicity. However, they often require extensive parameterization for accurate predictions. This often produces models with nonphysical parameters, whose complexity becomes comparable to electrochemical models. The second category considers electrochemical models, which account for the diffusion, intercalation, and electrochemical kinetics. Although these models can accurately predict internal state variables, their mathematical structure is generally too complex for controller/observer design. Therefore, these approaches combine model reduction and estimation techniques.

One possible model within this category is the use of a "single particle model" (SPM) of electrochemical battery dynamics in combination with an extended Kalman filter. Another approach is to employ residue grouping for model reduction and linear Kalman filters for observers. Also, simplifications can be applied to the electrolyte and solid phase concentration dynamics to perform SOC estimation.

However, all the simplified electrochemical models are parameterized and tested at a low c-rate because of the simplifications that have been implemented on the model.

The key idea of the SPM is that the solid phase of each electrode can be idealized as a single spherical particle. This model results are accurate if one assumes the electrolyte Li-concentration is constant in space and time. This assumption works well for small currents or electrolytes with large electronic conductivities. However, it induces errors at large current charge and discharge rates (C-rates) leading to poor SOC estimation at higher C-rates.

A complex model has better accuracy also for higher C-rates but cannot be implemented in real time applications.

The above described method for estimating a voltage of a battery directly addresses the previously stated technical challenges. By means of a C-rate adaptive model, the model is able to reduce errors in high c-rate operating ranges and thus, consequently increases the state of charge estimation accuracy.

According to one embodiment, the C-rate of the battery is compared with a first threshold. If the C-rate is higher than the first threshold, the battery model is adapted so that a complex model is achieved and if the C-rate is lower than the first threshold, the battery model is adapted so that a simplified model is achieved.

Since a complex model has better accuracy also for higher C-rates but cannot be implemented in real time applications and a simplified model can be used in real time applications and is accurate for low C-rates, it is advantageous to compare the C-rate with a threshold to choose if a complex or a simple model can be used.

According to a further embodiment the C-rate of the battery is compared with a first threshold and a second threshold which is smaller than the first threshold. If the C-rate is higher than the first threshold, the battery model is adapted so that a complex model is achieved. If the C-rate is lower than the first threshold and higher than the second threshold, the battery model is adapted so that a simplified model is achieved. If the C-rate is lower than the first threshold and higher than the second threshold, the battery model is adapted so that a simpler model than the simplified model is achieved.

By means of two thresholds a more detailed amendment of the battery model is possible.

According to a further embodiment, the value of the second threshold is between 2C and 4C, as, for example, 2C, 3C or 4C.

In particular for C-rates lower than 2C to 4C a very simple battery model is accurate enough for the estimation of the voltage. Thus, it is advantageous to choose a value of the second threshold between 2C and 4C.

Since the method can be used for charging and discharging, the second threshold can also be between −2C and −4C, as, for example, −2C, −3C or −4C.

According to a further embodiment, the value of the first threshold is between 8C and 12C, as, for example, 8C, 9C, 10C, 11C or 12C.

In particular for C-rates higher than 8C to 12C a very complex battery model is needed for the estimation of the voltage. Thus, it is advantageous to choose a value of the first threshold between 8C to 12C.

Since the method can be used for charging and discharging, the first threshold can also be between −8C and −12C, as, for example, −8C, −9C, −10C, −11C or −12C.

According to a further embodiment, given model parameters of the battery model are adapted based on the C-rate.

According to a further embodiment a given set of equations of the battery model are adapted based on the C-rate.

Exemplary embodiments of the invention are explained in the following with the aid of schematic drawings.

Figure 2:
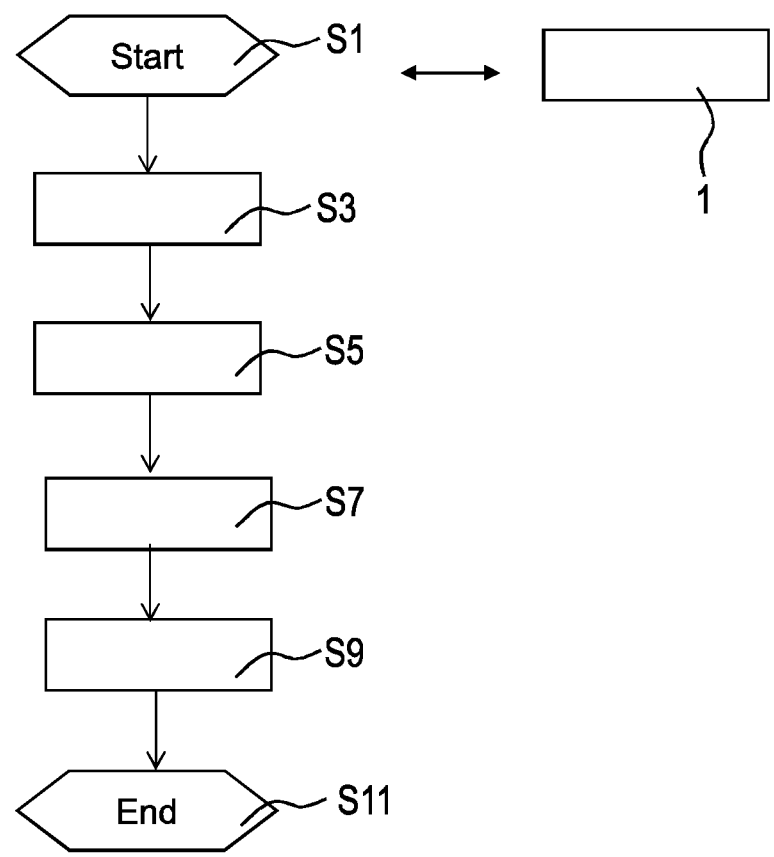

These are as follows:

FIG. 1 a schematic representation of Single Particle Model;

FIG. 2 a flowchart of a program for estimating a voltage of a battery; and

Figure 3:
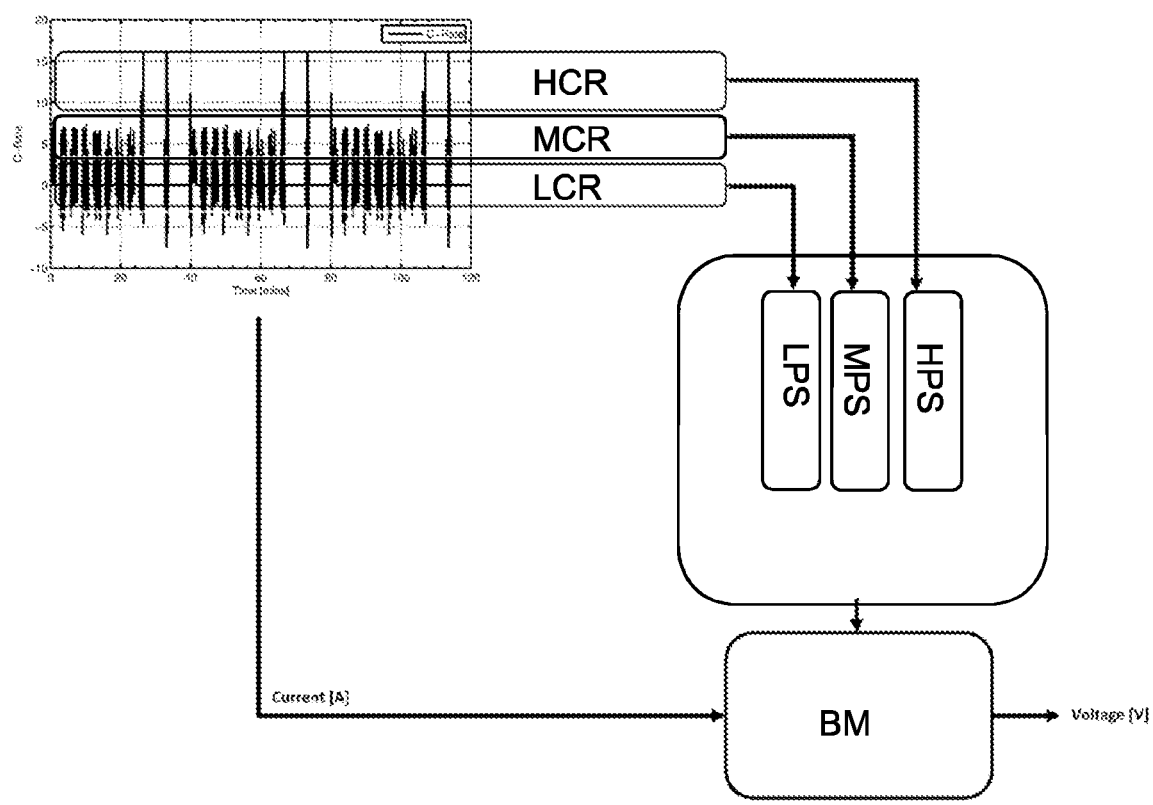

FIG. 3 an example of an adaption of a battery model.

FIG. 1 is a schematic representation of Single Particle Model (SPM).

The SPM was first applied to lithium battery systems in 2005 by "Review of models for predicting the cycling performance of lithium ion batteries". FIG. 1 provides a schematic of the SPM concept. Mathematically, the model consists of two diffusion Partial Differential Equations (PDEs) governing each electrode's concentration dynamics, where input current enters as a Neumann boundary condition. Output voltage is given by a nonlinear function of the state values at the boundary and the input current. Although this model captures less dynamic behaviour than other electrochemical-based estimation models, its mathematical structure is amenable to real time implementation.

This SPM works well for small currents or electrolytes with large electronic conductivities. However, it induces errors at large current charge and discharge rates (C-rates) leading to poor SOC estimation at higher C-rates.

A complex model has better accuracy also for higher C-rates but cannot be implemented in real time applications.

FIG. 2 shows a flowchart of a program for estimating a voltage of a battery. The program can be executed by a device 1.

In a step S1 the program is started and, for example, variables are initialized.

In a step S3 a given battery model BM is provided, wherein the given battery model BM is a single particle model, as, for example, a SPM as explained above.

In a step S5 a C-rate of the battery is determined, wherein the C-rate relates to the charge or discharge current in reference to the capacity of the battery.

In a step S7 the battery model BM is adapted based on the C-rate.

To adapt the battery model BM, for example, the C-rate of the battery is compared with a first threshold and if the C-rate is higher than the first threshold, the battery model BM is adapted so that a complex model is achieved and if the C-rate is lower than the first threshold, the battery model BM is adapted so that a simplified model is achieved.

Another way to adapt the battery model BM is, for example to compare the C-rate of the battery with a first threshold and a second threshold which is smaller than the first threshold. If the C-rate is higher than the first threshold, the battery model BM is adapted so that a complex model is achieved. If the C-rate is lower than the first threshold and higher than the second threshold, the battery model BM is adapted so that a simplified model is achieved. If the C-rate is lower than the first threshold and higher than the second threshold, the battery model BM is adapted so that a simpler model than the simplified model is achieved.

The first and the second threshold can, for example, be chosen as shown in FIG. 3. The value of the first threshold is, for example, between 8C and 12C, as, for example, 8C, 9C, 10C, 11C or 12C and/or, since the method can be used for charging and discharging, the first threshold can also be between −8C and −12C, as, for example, −8C, −9C, −10C, −11C or −12C. The value of the second threshold is, for example, between 2C and 4C, as, for example, 2C, 3C or 4C and/or, since the method can be used for charging and discharging, the second threshold can also be between −2C and −4C, as, for example, −2C, −3C or −4C.

To adapt the battery model BM, for example, given model parameters of the battery model BM are adapted based on the C-rate and or a given set of equations of the battery model BM are adapted based on the C-rate.

In a step S9 the voltage of the battery is estimated by means of the adapted battery model BM.

In a step S11 the program is stopped and can be started again in the step S1.

FIG. 3 gives an example of the adaption. Based on the second and first threshold and the C-rate, the battery is divided in three operation ranges, a high C-rate operation range HCR (C-rate higher than the first threshold), a medium C-rate operation range MCR (C-rate higher than the second threshold and lower than the first threshold) and a low C-rate operation range LCR (C-rate lower than the second threshold). Based on the operation range a parameter set is selected, a high C-rate parameter set HPS for the high C-rate operation range HCR, a medium C-Rate parameter set MPS for the medium C-rate operation range MCR and a low C-rate parameter set LPS for the low C-Rate operation range LCR.

Based on the chosen parameter set the battery model BM is adapted. Thus, the model parameters and set of equations changes with C-rate to better adapt the high dynamic operations of the battery in real time applications. At high C-rate where a complex model is required, a parameter set will be activated to allow the model to perform, for example, with the whole set of equations, while at lower C-rate where the simple model is enough, another set of parameters will be activated.

Thus, by means of the above described method, the model is able to reduce errors in high c-rate operating ranges and consequently increases the state of charge estimation accuracy.

We claim:

1. A method for estimating a voltage of a battery, the method comprising:
providing a battery model (BM), wherein the battery model (BM) is a single particle model;

operating the battery having multiple operation ranges;
determining a C-rate of the battery, wherein the battery has a capacity, and wherein the C-rate relates to a charge or discharge current in reference to the capacity of the battery;
adapting the battery model (BM) based on the C-rate, to adapt to operations of the battery in real time;
estimating the voltage of the battery using the adapted battery model (BM); and
determining a state of charge of the battery based on the voltage of the battery,
wherein:
the battery operates in real time, and the battery module (BM) is adapted to the operations of the battery in real time;
the C-rate of the battery is compared with a first threshold;
when the C-rate is higher than the first threshold, the battery model (BM) is adapted so that a first model having higher accuracy is used; and
when the C-rate is lower than the first threshold, the battery model (BM) is adapted so that a second model having lower accuracy is used.

2. The method according to claim 1, wherein:
the C-rate of the battery is compared with a second threshold which is smaller than the first threshold;
when the C-rate is lower than the first threshold and higher than the second threshold, the battery model (BM) is adapted so that the second model is used; and
when the C-rate is lower than the second threshold, the battery model (BM) is adapted so that a third model is used.

3. The method according to claim 2, wherein a value of the second threshold is between 2C and 4C.

4. The method according to claim 2, wherein a value of the first threshold is between 8C and 12C.

5. The method according to claim 1, wherein given model parameters of the battery model (BM) are adapted based on the C-rate.

6. The method according to claim 1, wherein a given set of equations of the battery model (BM) are adapted based on the C-rate.

7. A device for estimating a voltage of a battery, wherein the device is designed to execute the method according to claim 1.

8. The method according to claim 1, wherein:
when the first model is used, a first set of parameters is activated to allow the first model to perform with a set of equations; and
when the second model is used, another set of parameters is activated.

* * * * *